United States Patent
Corbin, Jr. et al.

(10) Patent No.: US 6,921,272 B2
(45) Date of Patent: Jul. 26, 2005

(54) METHOD AND APPARATUS FOR PROVIDING POSITIVE CONTACT FORCE IN AN ELECTRICAL ASSEMBLY

(75) Inventors: John S. Corbin, Jr., Austin, TX (US); William P. Kostenko, Poughkeepsie, NY (US); John J. Loparco, Poughkeepsie, NY (US); Budy D. Notohardjono, Poughkeepsie, NY (US); John G. Torok, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 18 days.

(21) Appl. No.: 10/435,917

(22) Filed: May 12, 2003

(65) Prior Publication Data

US 2004/0229481 A1 Nov. 18, 2004

(51) Int. Cl.[7] .............................................. H01R 12/00
(52) U.S. Cl. ........................................ 439/73; 439/591
(58) Field of Search .......................... 439/66, 591, 65, 439/71, 73

(56) References Cited

U.S. PATENT DOCUMENTS

| | | | | |
|---|---|---|---|---|
| 5,109,320 A | * | 4/1992 | Bourdelaise et al. | 361/785 |
| 5,109,596 A | * | 5/1992 | Driller et al. | 29/705 |
| 5,819,406 A | * | 10/1998 | Yoshizawa et al. | 439/66 |
| 5,909,123 A | | 6/1999 | Budnaitis | 324/760 |
| 5,911,583 A | | 6/1999 | Roybal et al. | 439/66 |
| 5,967,804 A | | 10/1999 | Yoshizawa et al. | 439/91 |
| 5,984,691 A | * | 11/1999 | Brodsky et al. | 439/66 |
| 6,046,060 A | | 4/2000 | Budnaitis | 438/10 |
| 6,086,386 A | * | 7/2000 | Fjelstad et al. | 439/70 |
| 6,402,526 B1 | * | 6/2002 | Schreiber et al. | 439/67 |
| 6,475,011 B1 | | 11/2002 | Sinha et al. | 439/330 |
| 6,485,311 B2 | | 11/2002 | Torok et al. | 439/73 |
| 6,524,115 B1 | * | 2/2003 | Gates et al. | 439/66 |
| 6,540,525 B1 | * | 4/2003 | Li et al. | 439/66 |
| 6,774,306 B2 | * | 8/2004 | Smith | 174/52.2 |

* cited by examiner

*Primary Examiner*—Renee Luebke
*Assistant Examiner*—Briggitte R. Hammond
(74) *Attorney, Agent, or Firm*—Lily Neff; Cantor Colburn LLP

(57) ABSTRACT

An electrical contact assembly includes a first module having a first set of electrical contacts, a second module having a second set of electrical contacts, a shape-generating module, and a clamping arrangement. The second set of electrical contacts is aligned with the first set of electrical contacts and the shape-generating module is arranged to impart a shape to the second module such that the second set of electrical contacts is driven toward the first set of electrical contacts. The clamping arrangement is arranged to clamp the first, the second, and the shape-generating modules together, thereby resulting in a positive contact force between the first and second sets of electrical contacts. The positive contact force is equal to or greater than a predefined value.

26 Claims, 5 Drawing Sheets

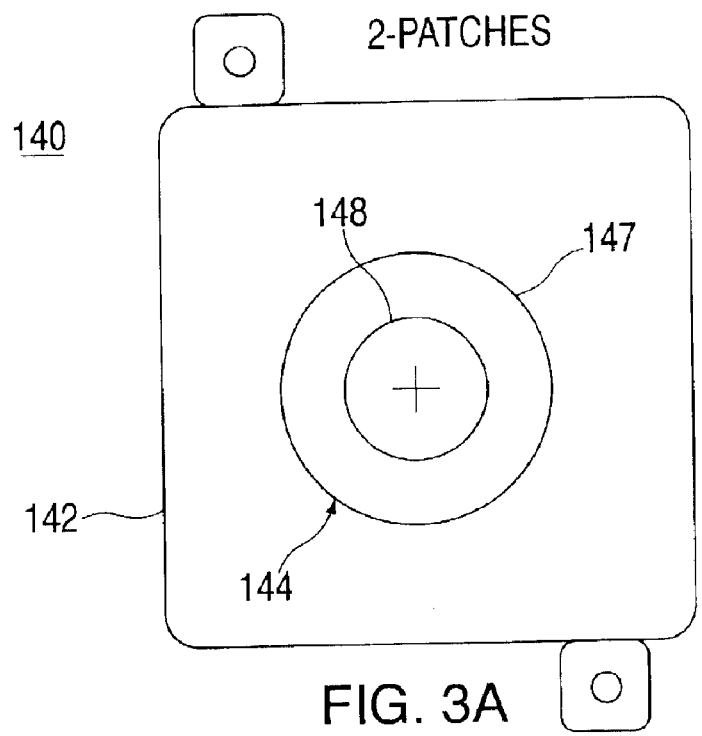
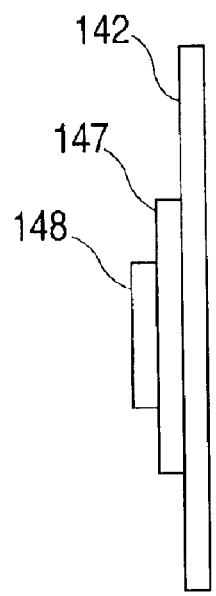
FIG. 3A  FIG. 3B
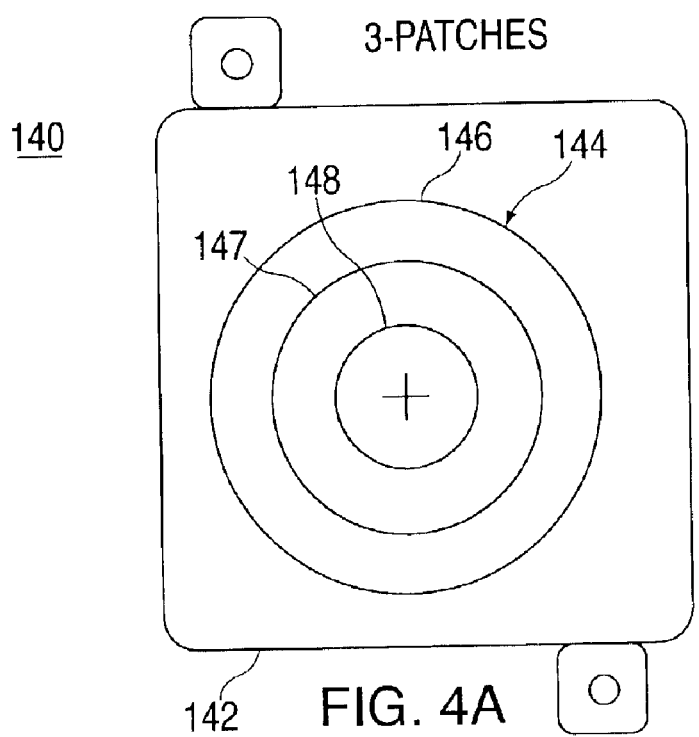
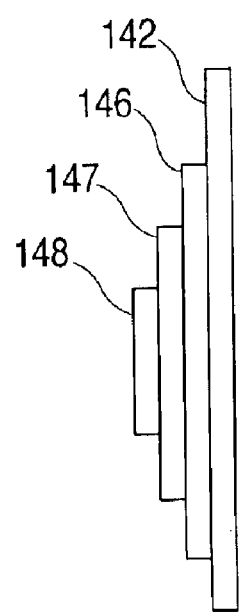
FIG. 4A  FIG. 4B

METHOD AND APPARATUS FOR PROVIDING POSITIVE CONTACT FORCE IN AN ELECTRICAL ASSEMBLY

BACKGROUND OF THE INVENTION

The present disclosure relates generally to a method and apparatus for providing positive contact force in an electrical contact assembly, and particularly to an electrical contact assembly having an Electronic Module (EM), such as a Single-Chip Module (SCM) or a Multi-Chip Module (MCM) for example, that may have a non-planar back that electrically mates with a Printed Circuit Board (PCB).

The continuous development in the electronics and computer industry has resulted in larger Electronic Modules (such as Multi-Chip Modules) being packaged in smaller spatial environments. Coupled with this density increase is a need to connect an increased number of processing module input/output terminals to PCBs. One device for interconnecting a high number of input/output terminals on a processing module to a PCB is a Land Grid Array (LGA) interconnect. Typically, a LGA interconnect is sandwiched between the processing module and the PCB to provide electrical connection between the terminals on the processing module and interconnects (such as pads and plated vias for example) on the PCB.

Some designs use clamping techniques to apply force to the processing module to maintain electrical contact between the processing module, the LGA interconnect and the PCB. However, the bottom mating surface of the EM and the top surface of the PCB may be non-planar, with a surface camber that may vary significantly, such as about +/−75 micrometers for example. In addition to a non-planar EM bottom surface, the LGA interconnect may not have sufficient compressive compliancy to absorb the effects of surface irregularities and structural deflections with the clamping techniques employed. Increasing the global clamping force may not be an option due to the increase in stress that the substrate of the EM may encounter, thereby possibly resulting in reduced life expectancy of the EM. Accordingly, it would be advantageous to have a method and apparatus for providing positive contact force in an EM assembly, as well as other face-to-face contact assemblies, without incurring undue component stress.

SUMMARY OF THE INVENTION

In one embodiment, an electrical contact assembly includes a first module having a first set of electrical contacts, a second module having a second set of electrical contacts, a shape-generating module, and a clamping arrangement. The second set of electrical contacts is aligned with the first set of electrical contacts and the shape-generating module is arranged to impart a shape to the second module such that the second set of electrical contacts is driven toward the first set of electrical contacts. The clamping arrangement is arranged to clamp the first, the second, and the shape-generating modules together, thereby resulting in a positive contact force between the first and second sets of electrical contacts. The positive contact force is equal to or greater than a predefined value.

In another embodiment, a method of providing positive contact force in an electrical contact assembly is provided. A first set of electrical contacts is arranged in opposition to a second set of electrical contacts to provide an electrical contact arrangement. A shape-generating component is arranged proximate to and clamped toward the electrical contact arrangement. In the clamped assembly, one set of contacts is shaped in the direction of the other set to provide a positive contact force between the first and second sets of contacts.

In a further embodiment, a multi-chip module assembly includes a layered assembly having a multi-chip module, a printed circuit board and an interconnect disposed therebetween, wherein the multi-chip module, printed circuit board, and interconnect have mating sets of electrical contacts. The assembly includes means for clamping the layered assembly together and means for producing a shape in the printed circuit board such that a portion of the printed circuit board is driven toward the multi-chip module. In response to the shaping, a positive contact force results between the mating sets of electrical contacts.

BRIEF DESCRIPTION OF THE DRAWINGS

Referring to the exemplary drawings wherein like elements are numbered alike in the accompanying Figures:

FIG. 3A is a plan view of an exemplary shape-generating module in accordance with an embodiment of the invention;

FIG. 3B is a side view of the module of FIG. 3A;

FIG. 4A is a plan view of an alternative module to that depicted in FIG. 3A;

FIG. 4B is a side view of the module of FIG. 4A;

DETAILED DESCRIPTION OF THE INVENTION

An embodiment of the present invention provides a Processing Module (PM) assembly, such as an Electronic Module (EM) assembly that includes a Land Grid Array (LGA) interconnect between the EM and a Printed Circuit Board (PCB), with a positive contact force between the EM and the mating surface of the PCB, the contact force being equal to or greater than a predefined value. While embodiments described herein depict an EM assembly as an exemplary mating contact assembly having a positive contact force arrangement, it will be appreciated that the disclosed invention is also applicable to other mating contact assemblies, such as PM-to-PCB, or PCB-to-PCB, for example.

Figure 1:
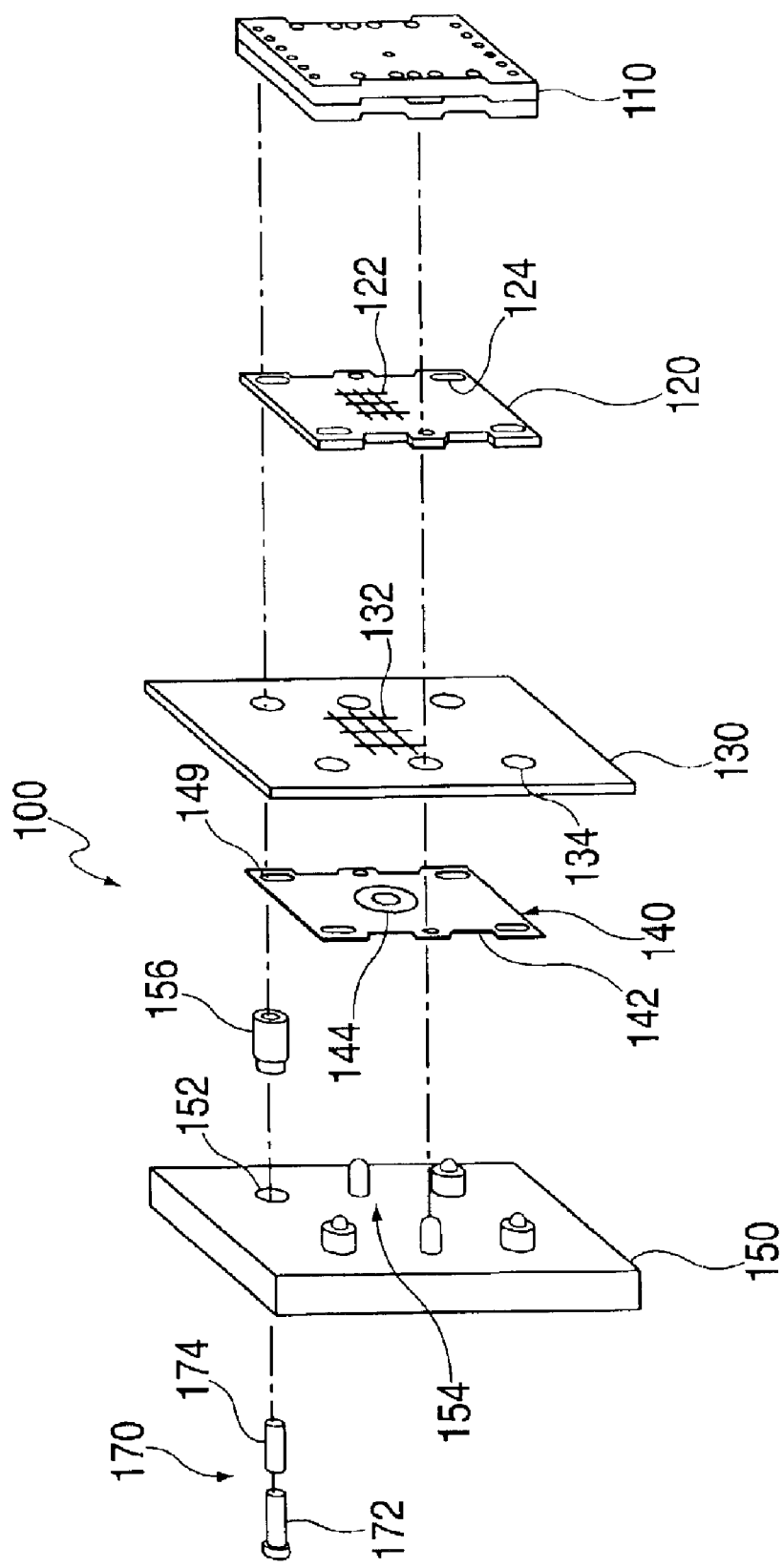
FIG. 1 is an exploded perspective view of an exemplary electrical assembly in accordance with an embodiment of the invention.

FIG. 1 is an exploded assembly view of an exemplary embodiment of an EM assembly 100 having an EM 110 (also herein referred to as a first module), an interconnect 120 (also herein referred to as a second module), a PCB 130 (also herein referred to as an intermediate surface), a Shape-Generating Module (SGM) 140, to be discussed in more detail below, and a support base 150 (also herein referred to as a stiffening surface) made of aluminum, but which may be made of any material suitable for providing a stiffening surface, such as stiff plastic or other metallic for example. In an exemplary embodiment, interconnect 120 is a LGA including an array of contacts (for example, inter-twined balls of gold wire) arranged in a pattern matching a pattern of terminals on the bottom of EM 110 for providing an electrical connection between EM 110 and PCB 130. Interconnect 120 may employ any area array compression contact-based electrical connection technique.

Figure 2:
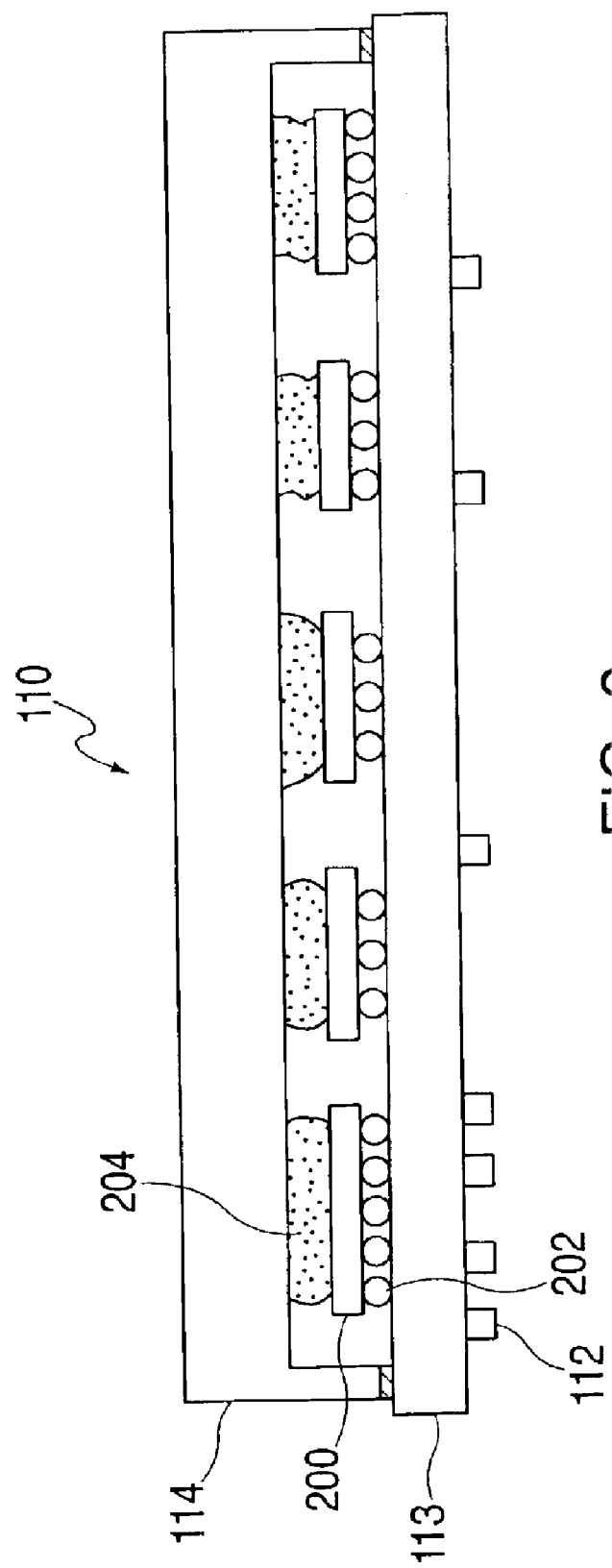
FIG. 2 is a cross-sectional view of an exemplary processing module.

EM 110 includes a set of electrical contacts 112, best seen by referring to FIG. 2, on the bottom (side facing interconnect 120). In an embodiment, electrical contacts 112 are configured as surface pads, thereby providing contact faces for a face-to-face contact arrangement with a mating set of contacts. While FIG. 2 depicts an array of electrical contacts 112 having a defined number of contacts, the artisan will appreciate that this is illustrative only and that EM 110 may have thousands of electrical contacts arranged in a variety of columns and rows. An exemplary EM 110 has an overall dimension of about 120 mm (millimeters) by about 160 mm, and has about 72 columns by about 72 rows of electrical contacts. The artisan will also appreciate that the term "a set of contacts" is not limited to an array of contacts of a given dimension, and may be a one-dimensional array, a two-dimensional array, or arranged in any structured or non-structured pattern. Also, the artisan will appreciate that a contact pad typically has a two-dimensional face, thereby resulting in a one-dimensional array having two dimensions with respect to the contact pad structure itself. As shown, EM 110 includes a base 113 and a cover 114. Housed between base 113 and cover 114 are a plurality of electronic component(s) (EC) 200, each EC 200 having input/output leads 202 that are electrically connected to EM electrical contacts (input/output terminals) 112. Electrical contacts 112 may be implemented using a variety of structures such as pads, balls, pins, for example. The pattern of contacts on interconnect 120 corresponds to the pattern of terminals 112 on EM 110. Each EC 200 may be in thermal communication with cover 114 through thermally conductive compounds 204. In this manner, heat from each EC 200 may be dissipated through the thermally conductive compound 204 and cover 114. Such dissipation may occur by placing heart sinks on cover 114. More sophisticated cooling devices, such as refrigerant based coolers, may be placed in thermal communication with cover 114.

PCB 130 has a mating set of contacts, depicted generally as 132, which are configured to mate with electrical contacts 112 of EM 110. Interconnect 120 also includes a mating set of contacts, depicted generally as 122, which are configured to mate with electrical contacts 112 and 132 of EM 110 and PCB 130, respectively. Electrical contacts 122 of interconnect 120 are arranged to provide a desired pattern of electrical connections between EM 110 and PCB 130, which may be but is not necessarily in a one-to-one correlation. Interconnect 120 is arranged between EM 110 and PCB 130, thereby providing the desired electrical path between the two. PCB 130 may include leads from electrical contacts 132 to other portions of PCB 130 for interfacing with EM 110.

SGM 140 includes an insulator 142, that prevents circuit traces on the bottom of PCB 130 from making electrical contact with support base 150 to prevent shorting, and a set of Shape-Generating Patches (SGP) 144, best seen by now referring to FIGS. 3A–4B. FIGS. 3A and 4A depict plan views, and FIGS. 3B and 4B depict respective side views, of alternative SGMs 140. FIGS. 3A–B depict a SGM 140 having a set of two SGP 144, while FIGS. 4A–B depict a SGM 140 having a set of three SGP 144. Alternative embodiments may have other quantities of patches in SGP 144. In an embodiment, SGP 144 includes patch 146 having a diameter of 60 mm, patch 147 having a diameter of 42 mm, and patch 148 having a diameter of 24 mm, as depicted in FIGS. 4A–B. In an alternative embodiment, SGP 144 includes patch 147 having a diameter of 42 mm and patch 148 having a diameter of 24 mm, as depicted in FIGS. 3A–B. In an embodiment, patches 146, 147, 148 are made of 0.0015-inch thick high-temperature insulative material having an adhesive backing and have a circular shape, however, embodiments of the invention are not limited to such constraints. For example, patches 146, 147, 148 may be non-circular, such as oval or rectangular, may be of a different overall dimension, may be of a different thickness, may be of a non-uniform thickness, such as domed, and may be of a different material, adhesive-backed or not, providing the desired shape and contact force as herein disclosed results. By arranging patches 146, 147, 148 of differing diameters on top of each other, a generally dome-shaped set of SGP 144 can be achieved, which results in a dome-shape at PCB 130. Also, SGM 140 is not limited to just one set of SGP 144, but may include a plurality of SGP 144, depending on the bottom contour of EM 110 and the desired contact force thereat.

Referring now back to FIG. 1, SGM 140 is arranged between PCB 130 and surface 154 of support base 150, thereby positioning SGP 144 on the side of PCB 130 opposite to the side having electrical contacts 132. In the assembled state, spring-equipped screws 170 (having screw 172 and spring 174) pass through holes 152 on base 150 and holes 134 on PCB 130 into threads (not shown) of EM 110, thereby creating a sandwiched EM assembly 100. Interconnect 120 and SGM 140 may also include holes 124, 149, respectively, for receiving screw 172. A sleeve 156 may be incorporated and assembled through holes 152, 149, 134, and 124, to further isolate screw 172 from electrical traces. In an embodiment, spring 174 is constrained at one end by structural detail (not shown but known in the art) at EM 110, and at the other end by a shouldered head on screw 172, thereby providing an arrangement that elastically clamps EM assembly 100 together. Other techniques for providing an elastic clamp having other biasing means, such as a leaf spring or a compressible material, for example, may be employed. In the assembled state and with screws 170 torqued to their predefined value, SGP 144 on SGM 140 presses against the underside (side opposite contacts 132) of PCB 130 thereby imparting a shape to PCB 130 that drives electrical contacts 132 in the direction toward interconnect 120 and EM 110. In an embodiment, the resulting shape produces a positive contact force between electrical contacts 112 and 132 that is greater than 0-grams (gms), that is preferably equal to or greater than 10 gms, and that is more preferably equal to or greater than 20 gms. Alternative connection systems may employ other minimum positive contact forces that are different from the exemplary predefined minimum positive contact forces of 10 gms or 20 gms.

Figure 5:
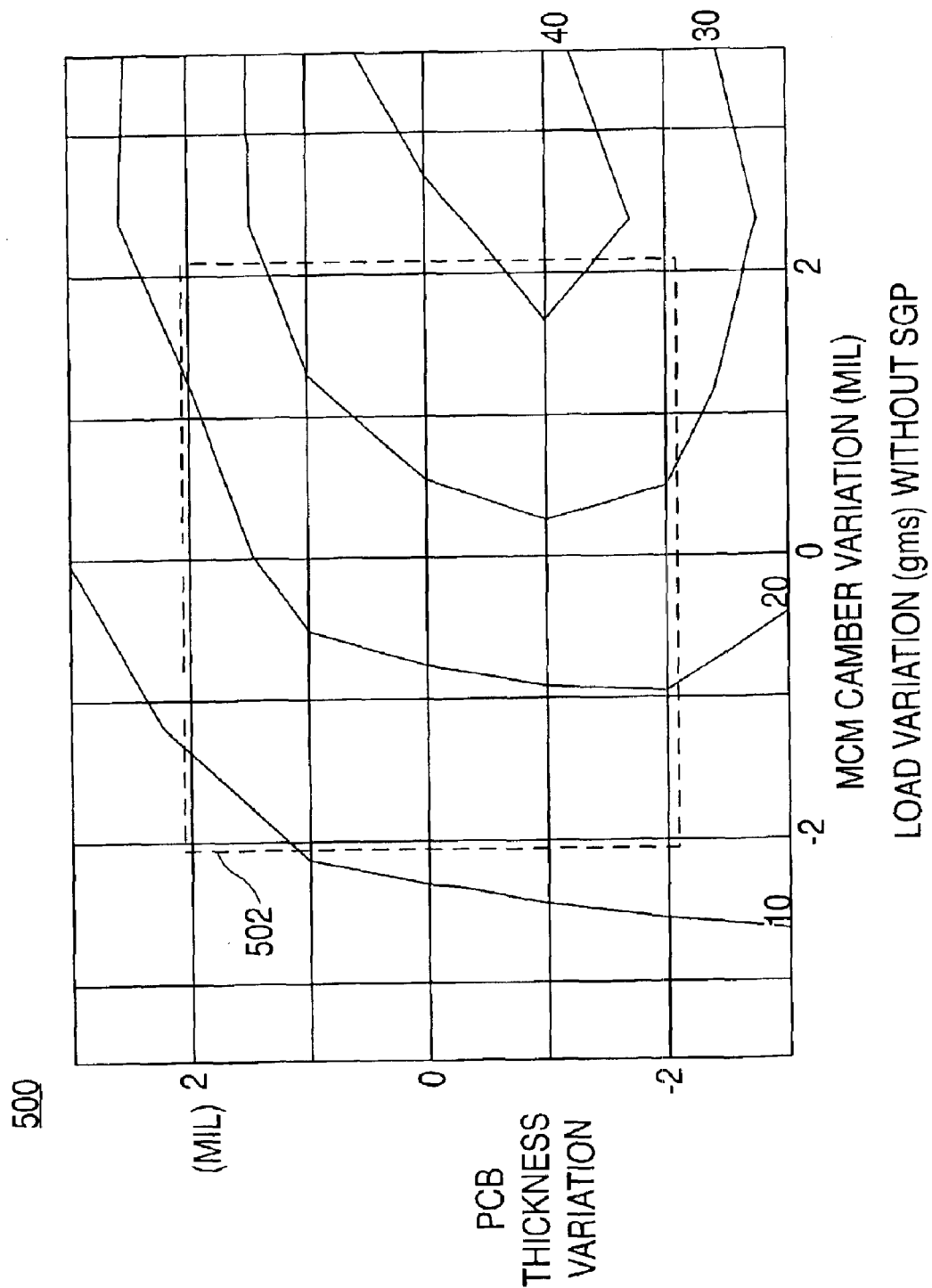
FIG. 5 is a graphical illustration of contact load variation as a function of production parameters within an assembly represented by FIG. 1 absent an embodiment of the invention.
Figure 6:
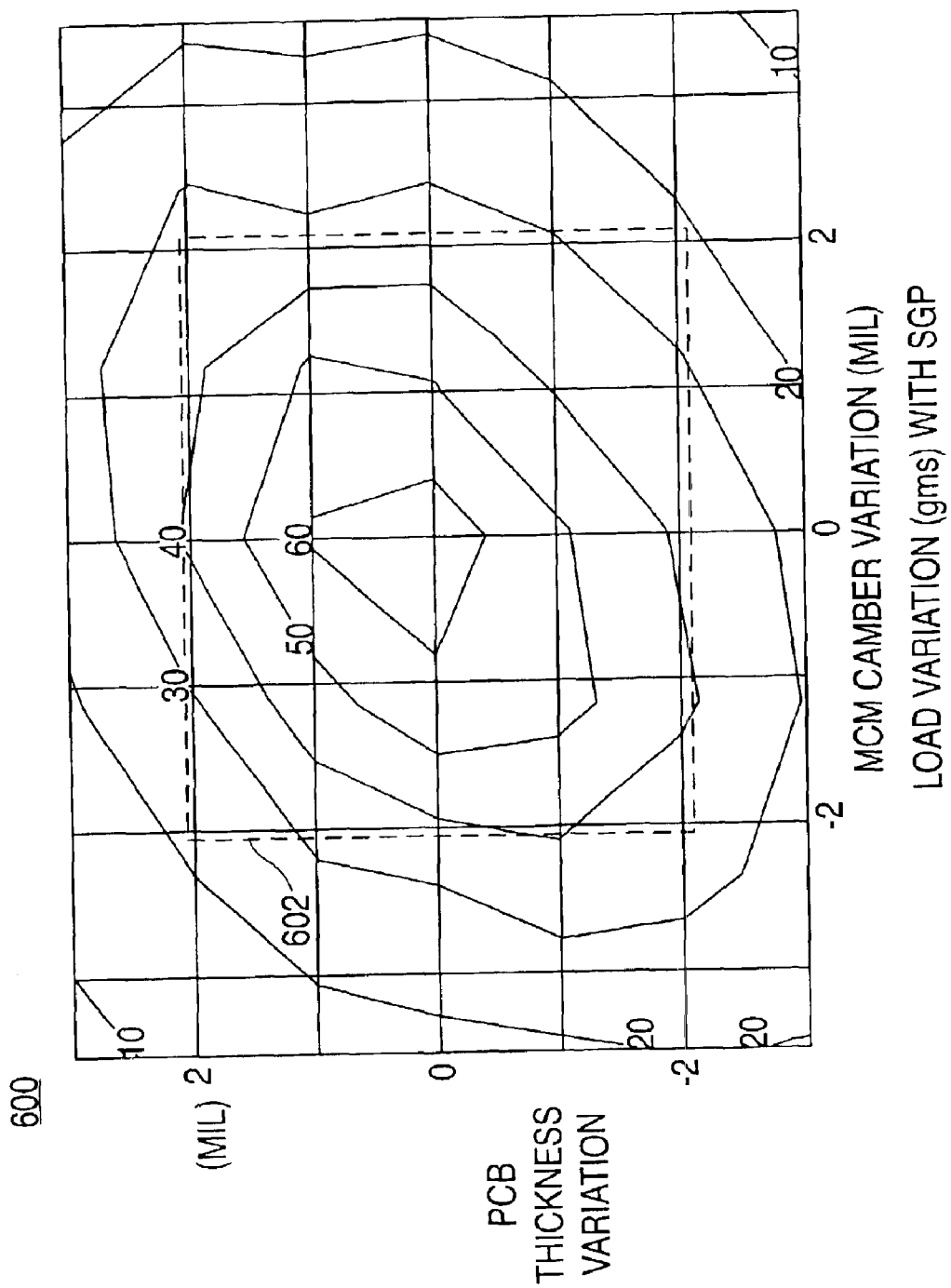
FIG. 6 is a graphical illustration of contact load variation as a function of production parameters within an assembly represented by FIG. 1 in accordance with an embodiment of the invention.

FIGS. 5 and 6 represent load profiles 500, 600, respectively, between electrical contacts 112 and 132 as a function of the surface camber of EM 110 (also referred to as the co-planarity characteristics of the as-sintered bottom-surface-metallurgy (BSM) of EM 110) and board thickness of PCB 130. FIG. 5 depicts the load profile 500 in the absence of SGP 144, while FIG. 6 depicts an embodiment of the minimum load profile 600 in the presence of an embodiment of SGP 144. The x-axes represent the variation in surface camber in mils (0.001-inches) about a nominal zero point, and the y-axes represent the variation in board thickness in mils about a nominal zero point. The plotted contour lines depict an embodiment of the minimum electrical contact force in grams, as indicated by numerals at the contour lines. In an embodiment, the variation in surface camber varies from about −2 mils to about +2 mils, and the variation in board thickness varies from about −2 mils to about +2 mils, depicted by dashed-line boxes 502, 602 in FIGS. 5 and 6. As discussed above, within these ranges of variation it is more preferable to have a contact force of equal to or greater than about 20 gms. Within dashed-line box 502 of FIG. 5 (in the absence of SGP 144), the contact force is depicted as varying from less than 10 gms (in the upper left hand corner) to greater than about 40 gms (in the lower right hand side). Within dashed-line box 602 of FIG. 6 (in the presence of SGP 144), the contact force is depicted as varying from greater than about 20 gms (in the upper left hand and lower right hand corners) to greater than about 60 gms (toward the center). As depicted, the presence of SGP 144 provides a contact force of greater than about 20 gms, while the absence of SGP 144 does not.

While an embodiment of the invention is depicted in FIG. 1 as having electrical contacts 112, 132 on EM 110 and PCB 130, respectively, with Interconnect 120 disposed therebetween, it will be appreciated that alternative arrangements having face-to-face pressure contacts (alternatively force actuated contacts) may benefit from the shape-generating advantages of an embodiment of the invention. For example, in an alternative embodiment, EM 110 is assembled to PCB 130 absent Interconnect 120, with SGM 140 disposed between PCB 130 and base 150. Here, SGM 140 produces a shape at PCB 130 in the vicinity of contacts 132 in the direction of EM 110, thereby driving contacts 132 against contacts 112 for positive contact engagement.

In another alternative embodiment, EM 110 may be replaced with a second printed circuit board (not shown) having a second set of contacts for mating with contacts 132 of PCB 130. In this alternative embodiment, Interconnect 120 may or may not be used depending on the application needs. Here, and in the assembled state, SGM 140, disposed between PCB 130 and base 150, would produce a shape at PCB 130 in the vicinity of contacts 132 in the direction of the second printed circuit board, thereby driving contacts 132 against the second set of mating contacts on the second printed circuit board.

In yet another alternative embodiment, support base 150 is made of an insulative material, such as plastic, and SGP 144 is molded integral with base 150. Here, customizing base 150 with SGP 144 to match the surface camber of a particular EM 110 may be accomplished by oversizing the geometry of integral SGP 144 and using automated micromachining techniques to remove material from SGP 144 as needed.

Other alternative embodiments involving force actuated contact assemblies, and specifically face-to-face contact assemblies, may benefit by having a shape-generating arrangement that produces a positive contact force across mating sets of contacts.

Some embodiments of the invention have some of the following advantages: compensation for the structural deflection that typically results during the assembly of an EM to a PCB; positive contact engagement above a predefined value between mating sets of contacts of a PCB and an EM; a contact force on a set of face-to-face contacts uniformly greater than about 10 gms, and preferably uniformly greater than about 20 gms; localized shape in a layered contact arrangement that does not overburden a clamping arrangement; ability to customize the shape of a contact assembly to compensate for or match the general shape at an EM mating surface, thereby providing increased contact force at the contact assembly; an increase in contact force at the EM without an unnecessary increase in stress at the EM substrate; effective contact engagement on an EM having an as-sintered concave bottom surface; and, improved component life expectancy.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. An electrical contact assembly, comprising:
   a first module having a first set of electrical contacts;
   a second module having a first side with a second set of electrical contacts and an opposing second side, the second set of electrical contacts being aligned with the first set of electrical contacts;
   a shape-generating module arranged to impart a shape to the second side of the second module such that the second set of electrical contacts are driven toward the first set of electrical contacts, said shape-generating module further comprising a plurality of layers with each successive layer being smaller in overall dimension than the preceding layer; and
   a clamping arrangement arranged to clamp the first, the second, and the shape-generating modules together; wherein
   the clamped assembly of first, second, and shape-generating modules results in a positive contact force between the first and second sets of electrical contacts, the positive contact force being equal to or greater than a predefined value.

2. The assembly of claim 1, wherein the at least one layer comprises an oval shape.

3. The assembly of claim 1, further comprising:
   an intermediate module, having an interconnecting set of electrical contacts, disposed between the first module shape-generating module and the second module such that the shape-generating module imparts a shape to drive the second and the interconnecting sets of electrical contacts toward the first set of electrical contacts.

4. The assembly of claim 3, further comprising:
   a stiffening surface arranged such that the shape-generating module is disposed between the stiffening surface and the second module; wherein
   the clamped assembly of first module, intermediate module, second module, shape-generating module, and stiffening surface results in a shape in the direction of the first set of electrical contacts.

5. The assembly of claim 3, wherein the intermediate module comprises at least one of a land grid array interconnect and a ball grid array interconnect.

6. The assembly of claim 1, wherein each of the plurality of layers has a thickness and overall dimension such that a positive contact force of equal to or greater than a predefined value is developed between the first and second sets of electrical contacts.

7. The assembly of claim 6, wherein the predefined value is about 10 gms.

8. The assembly of claim 6, wherein the predefined value is about 20 gms.

9. The assembly of claim 1, wherein:

the first and second sets of electrical contacts are face-oriented contacts.

10. The assembly of claim 9, wherein the first module comprises either a multi-chip module or a printed circuit board.

11. The assembly of claim 10, wherein the second module comprises a printed circuit board.

12. A method of providing positive contact force in an electrical contact assembly, comprising:

arranging a first set of electrical contacts in opposition to a second set of electrical contacts to provide an electrical contact arrangement;

arranging a shape-generating component proximate to the electrical contact arrangement the shape-generating component having at least one layer of insulating material with each successive at least one layer being smaller in overall dimension than the preceding at least one layer; and clamping the shape-generating component toward the electrical contact arrangement thereby shaping one set of contacts in the direction of the other set to provide a positive contact force between the first and second sets of contacts.

13. The method of claim 12, wherein said shaping one set of contacts in the direction of the other set comprises:

shaping one set of contacts in a dome shape in the direction of the other set.

14. The method of claim 12 wherein:

said arranging a first set of electrical contacts in opposition to a second set of electrical contacts comprises arranging a multi-chip module in opposition to a printed circuit board.

15. The method of claim 12, wherein each set of electrical contacts comprise a plurality of face-to-face electrical contacts.

16. The method of claim 15, wherein each plurality of electrical contacts are configured in a two-dimensional arrangement.

17. The method of claim 16, wherein each two-dimensional arrangement of electrical contacts are configured in an array.

18. The method of claim 12, further comprising:

arranging an intermediate component having an interconnecting set of electrical contacts within the electrical contact arrangement to provide a multi-layer contact arrangement; and clamping the shape-generating component toward the multi-layer contact arrangement thereby shaping the second and interconnecting sets of contacts in the direction of the first set of electrical contacts to provide a positive contact force between the first, interconnecting, and second sets of electrical contacts.

19. The method of claim 18, further comprising:

arranging a stiffening component such that the shape-generating component is disposed between the stiffening component and the multi-layer contact arrangement; and clamping the stiffening component, shape-generating component, and multi-layer contact arrangement such that the shape-generating component shapes the multi-layer component to provide a positive contact force between the first, intermediate, and second sets of electrical contacts.

20. The method of claim 18, wherein:

the intermediate component comprises at least one of a land grid array interconnect and a ball grid array interconnect.

21. A multi-chip module assembly, comprising:

a layered assembly having a multi-chip module, a printed circuit board and a land grid array interconnect disposed therebetween, the multi-chip module, printed circuit board, and land grid array interconnect having mating sets of electrical contacts;

means for clamping the layered assembly together; and means for producing a shape in the printed circuit board such that a portion of the printed circuit board is driven toward the multi-chip module, said means for producing a shape including at least one layer of insulating material with each successive at least one layer being smaller in overall dimension than the preceding at least one layer; wherein a positive contact force results between the mating sets of electrical contacts.

22. The assembly of claim 21 wherein said means for producing a shape comprises:

means for producing a dome-shape in the printed circuit board.

23. The assembly of claim 21 wherein said means for clamping comprises:

means for elastically clamping the layered assembly together.

24. The assembly of claim 21 wherein said means for clamping further comprises:

means for producing a positive contact force between the mating sets of electrical contacts of equal to or greater than a predefined value.

25. The assembly of claim 24 wherein the predefined value is about 10 grams.

26. The assembly of claim 24, wherein the predefined value is about 20 grams.

* * * * *